US011195977B2

(12) United States Patent
Nakabayashi et al.

(10) Patent No.: US 11,195,977 B2
(45) Date of Patent: Dec. 7, 2021

(54) LIGHT EMITTING DEVICE

(71) Applicant: NICHIA CORPORATION, Anan (JP)

(72) Inventors: Takuya Nakabayashi, Tokushima (JP); Tetsuya Ishikawa, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/020,280

(22) Filed: Sep. 14, 2020

(65) Prior Publication Data

US 2020/0411735 A1  Dec. 31, 2020

Related U.S. Application Data

(63) Continuation of application No. 16/257,714, filed on Jan. 25, 2019, now Pat. No. 10,804,442.

(30) Foreign Application Priority Data

Jan. 29, 2018 (JP) .............................. JP2018-012569
May 16, 2018 (JP) .............................. JP2018-094611

(51) Int. Cl.
*H01L 33/50* (2010.01)
*H01L 33/60* (2010.01)

(52) U.S. Cl.
CPC ............ *H01L 33/504* (2013.01); *H01L 33/60* (2013.01); *H01L 2933/0016* (2013.01); *H01L 2933/0041* (2013.01)

(58) Field of Classification Search
CPC ....... H01L 33/504; H01L 33/60; H01L 33/62; H01L 33/486; H01L 33/58
See application file for complete search history.

(56) References Cited

U.S. PATENT DOCUMENTS 11,067,250 B2 *   7/2021   Yamada ................ F21V 17/002
2003/0080341 A1   5/2003   Sakano et al.
(Continued)

FOREIGN PATENT DOCUMENTS

JP     2009209192 A     9/2009
JP     2009256427 A     11/2009
(Continued)

OTHER PUBLICATIONS

Non-Final Office Action, United States Patent and Trademark Office, issued to U.S. Appl. No. 16/257,714 dated Mar. 3, 2020, 9 pages.

*Primary Examiner* — Joseph C. Nicely
(74) *Attorney, Agent, or Firm* — Hunton Andrews Kurth LLP

(57) ABSTRACT

A light emitting device includes a light emitting element including a first surface; a light guide member covering at least a part of a lateral surface of the light emitting element; a first wavelength conversion member covering the first surface and including a first wavelength conversion particles; and a reflective member being in contact with the light emitting element. The first wavelength conversion member has a thickness of 60 μm or more and 120 μm or less. The first wavelength conversion particles have an average particle size of 4 μm or longer and 12 μm or smaller; the first wavelength conversion particles have a central particle size of 4 μm or longer and 12 μm or smaller. A weight ratio of the first wavelength conversion particles is 60% by weight or more and 75% by weight or less with respect to the total weight of the first wavelength conversion member.

18 Claims, 6 Drawing Sheets

(56) References Cited

U.S. PATENT DOCUMENTS

| | | |
|---|---|---|
| 2006/0226759 A1 | 10/2006 | Masuda et al. |
| 2008/0149957 A1 | 6/2008 | Kameshima et al. |
| 2012/0028388 A1 | 2/2012 | Katayama |
| 2012/0248485 A1 | 10/2012 | Shinbori et al. |
| 2013/0270602 A1 | 10/2013 | Ko et al. |
| 2014/0008683 A1 | 1/2014 | Petersen et al. |
| 2015/0340547 A1 | 11/2015 | Tamaki |
| 2015/0340574 A1 | 11/2015 | Tamaki |
| 2016/0181473 A1* | 6/2016 | Hosokawa ............ H01L 33/504 257/43 |
| 2017/0107425 A1 | 4/2017 | Kaneyoshi et al. |
| 2017/0186920 A1* | 6/2017 | Kumano ............... H01L 33/502 |
| 2017/0294419 A1 | 10/2017 | Nakabayashi et al. |
| 2017/0294561 A1* | 10/2017 | Ikeda ................ C09K 11/0883 |
| 2018/0033929 A1 | 2/2018 | Baike |
| 2018/0155619 A1 | 6/2018 | Ooguri |
| 2018/0164277 A1 | 6/2018 | Watanabe et al. |
| 2019/0109266 A1 | 4/2019 | Hosokawa et al. |
| 2019/0198722 A1 | 6/2019 | Nakabayashi et al. |
| 2019/0237634 A1 | 8/2019 | Nakabayashi et al. |
| 2020/0044115 A1 | 2/2020 | Hashimoto et al. |

FOREIGN PATENT DOCUMENTS

| | | |
|---|---|---|
| JP | 2010004035 A | 1/2010 |
| JP | 2011228344 A | 11/2011 |
| JP | 2011249573 A | 12/2011 |
| JP | 2012049508 A | 3/2012 |
| JP | 2012124191 A | 6/2012 |
| JP | 2012134355 A | 7/2012 |
| JP | 2012216712 A | 11/2012 |
| JP | 2012244086 A | 12/2012 |
| JP | 2013168480 A | 8/2013 |
| JP | 2015038960 A | 2/2015 |
| JP | 2015065425 A | 4/2015 |
| JP | 2015220431 A | 12/2015 |
| JP | 2015220446 A | 12/2015 |
| JP | 2016001735 A | 1/2016 |
| JP | 2016072379 A | 5/2016 |
| JP | 2016127052 A | 7/2016 |
| JP | 2017117912 A | 6/2017 |
| JP | 2017188589 A | 10/2017 |
| JP | 2017188592 A | 10/2017 |
| JP | 2018012825 A | 1/2018 |
| JP | 2018018931 A | 2/2018 |
| WO | 02059982 A1 | 8/2002 |
| WO | 2006077740 A1 | 7/2006 |

\* cited by examiner

LIGHT EMITTING DEVICE

CROSS-REFERENCE TO RELATED APPLICATION

This is a continuation application of U.S. patent application Ser. No. 16/257,714, filed Jan. 25, 2019, which claims priority to Japanese Patent Application No. 2018-012569, filed on Jan. 29, 2018 and Japanese Patent Application No. 2018-094611, filed on May 16, 2018, the disclosures of which are hereby incorporated by reference in their entireties.

BACKGROUND

The present disclosure relates to a light emitting device.

A light emitting device including a light emitting element, an optical layer provided on the light emitting element and transmitting at least a part of light emitted by the light emitting element, and a plate-like optical member disposed on the optical layer and transmitting at least a part of the light emitted by the light emitting element is known (see, for example, Japanese Patent Publication No. 2012-134355).

SUMMARY

Such a light emitting device, when being used as a backlight unit or for lighting apparatus, is required to provide light with color non-uniformity regardless of light distribution angle.

In one general aspect, alight emitting device herein comprises a light emitting element having a first surface and a second surface located opposite to the first surface; a light guide member covering at least a part of a lateral surface of the light emitting element; a first wavelength conversion member covering the first surface, the first wavelength conversion member including a first matrix and first wavelength conversion particles; and a reflective member covering the lateral surface of the light emitting element, a lateral surface of the light guide member and a lateral surface of the first wavelength conversion member, the reflective member being in contact with the light emitting element. The first wavelength conversion member has a thickness in a range of 60 μm or more and 120 μm or less. The first wavelength conversion particles have an average particle size in a range of 4 μm or more and 12 μm or less. The first wavelength conversion particles have a central particle size of 4 μm or more and 12 μm or less. A weight ratio of the first wavelength conversion particles is in a range of 60% by weight or more and 75% by weight or less with respect to a total weight of the first wavelength conversion member.

According to the above aspect, it is possible to provide a light emitting device with less color non-uniformity of distributed light.

DETAILED DESCRIPTION

Figure 1A:
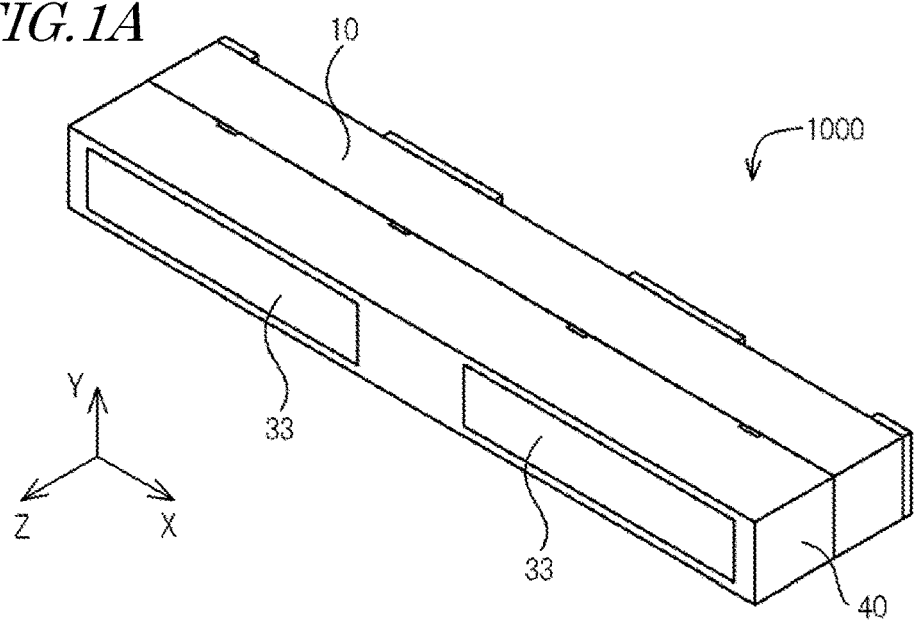
FIG. 1A is a schematic perspective view of a light emitting device according to an embodiment of the present disclosure.
Figure 1B:
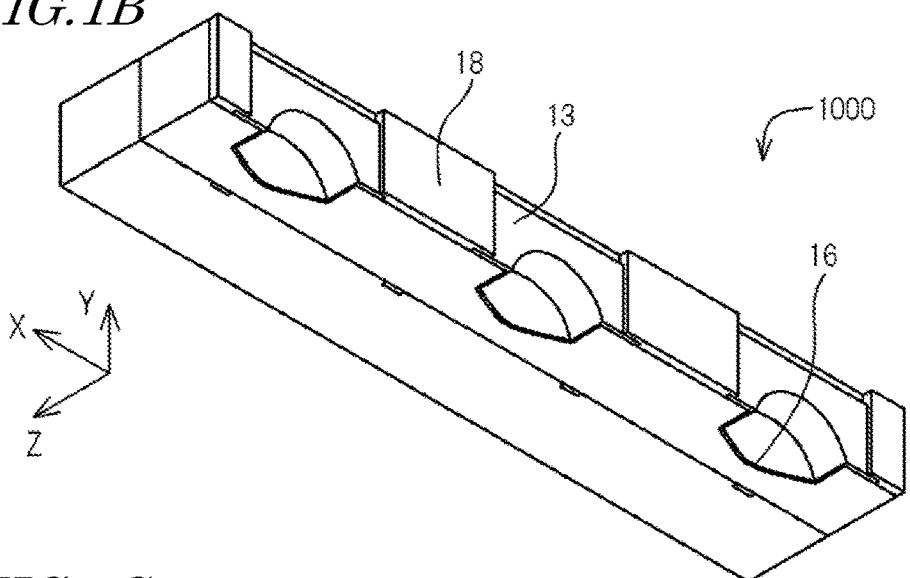
FIG. 1B is another schematic perspective view of the light emitting device in the embodiment.
Figure 1C:
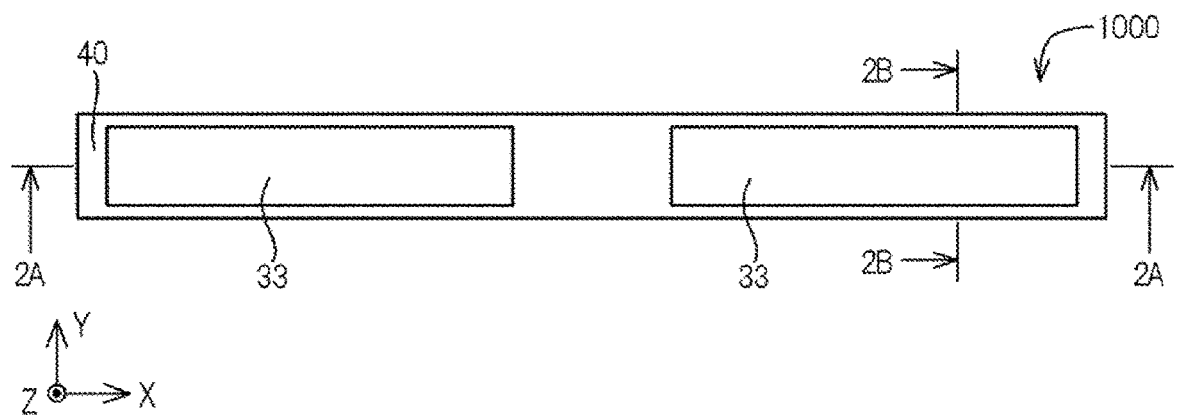
FIG. 1C is a schematic front view of the light emitting device in the embodiment.

Hereinafter, embodiments of the present disclosure will be described with reference to the attached drawings when necessary. Light emitting devices described below embody the technological idea of the present invention, and the present invention is not limited to any of the following embodiments unless otherwise specified. A content described in one embodiment is applicable to the modifications. In the drawings, the size, positional arrangement or the like may be emphasized for clear illustration.

A light emitting device 1000 in certain embodiment according to the present disclosure will be described with reference to FIG. 1A through FIG. 5B. The light emitting device 1000 includes at least one light emitting element 20, at least one light guide member 50, at least one first wavelength conversion member 31, and a reflective member 40. The light emitting element 20 includes a first surface 201, a second surface 203 located opposite to the first surface 201, and a lateral surfaces 202. The light guide member 50 covers the lateral surfaces 202 of the light emitting element 20. The first wavelength conversion member 31 covers the first surface 201 of the light emitting element 20. The first wavelength conversion member 31 includes a first matrix 312 and first wavelength conversion particles 311. The first wavelength conversion member 31 has a thickness in a range of 60 μm or more and 120 μm or less. The first wavelength conversion particles 311 have an average particle size in a range of 4 μm or more and 12 μm or smaller. The first wavelength conversion particles 311 have a central particle size of 4 μm or more and 12 μm or smaller. The first wavelength conversion particles 311 have a weight ratio in a range of 60% by weight or more and 75% by weight or less with respect to the total weight of the first wavelength conversion member 31. The reflective member 40 covers the lateral surfaces 202 of the light emitting element 20, lateral surfaces of the light guide member 50, and lateral surfaces of the first wavelength conversion member 31. The reflective member 40 is in contact with the light emitting element 20. The light emitting device 1000 may include at least one light emitting element 20. More specifically, the light emitting device 1000 may include one light emitting element 20 or a plurality of light emitting elements 20.

The average particle size of the first wavelength conversion particles 311 included in the first wavelength conversion member 31 is 4 μm or more and 12 μm or smaller. With the first wavelength conversion particles 311 having the average particle size of 12 μm or smaller, an interface between the first matrix 312 and the first wavelength conversion particles 311 is increased in the area size at the same concentration of the first wavelength conversion particles 311 included in the first wavelength conversion member 31. Such an interface, between the first matrix 312 and the first wavelength conversion particles 311, increased in the area size easily diffuses light from the light emitting element 20. As a result, the light from the light emitting element 20 is diffused in the first wavelength conversion member 31. This reduces color non-uniformity of distributed light of the light emitting device 1000. With the structure in which the average particle size of the first wavelength conversion particles 311 is 4 μm or more, the light from the light emitting element 20 is easily extracted, which can improve the light extraction efficiency of the light emitting device 1000.

In this specification, the "average particle size of the first wavelength conversion particles 311" is an average value of the particle sizes measured by an FSSS (Fisher Sub-Sieve Sizer) method. In order to measure the average particle size by the FSSS method, a Fisher Sub-Sieve Sizer Model 95 (produced by Fisher Scientific), for example, is usable.

The first wavelength conversion particles 311 included in the first wavelength conversion member 31 have a central particle size of 4 μm or more and 12 μm or smaller. With the structure in which the central particle size of the first wavelength conversion particles 311 is 12 μm or smaller, the interface between the first matrix 312 and the first wavelength conversion particles 311 is increased in the area size at the same concentration of the first wavelength conversion particles 311 included in the first wavelength conversion member 31. Such an interface, between the first matrix 312 and the first wavelength conversion particles 311, increased in the area size easily diffuses the light from the light emitting element 20. As a result, the light from the light emitting element 20 is diffused in the first wavelength conversion member 31. This can reduce color non-uniformity of distributed light of the light emitting device 1000. With the structure in which the central particle size of the first wavelength conversion particles 311 is 4 μm or more, the light from the light emitting element 20 is easily extracted, which can improve the light extraction efficiency of the light emitting device 1000.

In this specification, the central particle size of the first wavelength conversion particles 311 is the volume-average particle size (i.e., median diameter), namely, a particle size with which the volume cumulative frequency from the smaller diameter side reaches 50% (D50; median diameter). The central particle size may be measured by a laser diffraction particle size distribution measurement device (Master Sizer 2000 produced by Malvern Panalytical Ltd.).

It is preferred that the particle size of the first wavelength conversion particles 311 with which the volume cumulative frequency from the smaller diameter side reaches 10% (D10) is 6 μm or more and 10 μm or smaller. It is preferred that the particle size of the first wavelength conversion particles 311 with which the volume cumulative frequency from the smaller diameter side reaches 90% (D90) is 15 μm or more and 20 μm or smaller.

It is preferred that the first wavelength conversion particles 311 have a standard deviation (σlog) of the particle size distribution on the basis of volume of 0.3 μm or less. In the case where the diameters of the first wavelength conversion particles 311 are not much varied, the wavelength conversion member 31 may have a uniform thickness easily.

The first wavelength conversion particles 311 may comprise or be formed of, for example, a manganese-activated fluoride-based phosphor. The manganese-activated fluoride-based phosphor emits light having a relatively narrow spectral line width, and thus is advantageous from the point of view of color reproducibility.

The first wavelength conversion member 31 has a thickness in a range of 60 μm or more and 120 μm or less. With the structure in which the thickness of the first wavelength conversion member 31 is 60 μm or more, the amount of the first wavelength conversion particles 311 included in the first wavelength conversion member 31 can be increased. With the structure in which the thickness of the first wavelength conversion member 31 is 120 μm or less, the light emitting device 1000 can be made thinner. The "thickness of the first wavelength conversion member 31" is a length of the first wavelength conversion member 31 in a Z direction.

The first wavelength conversion particles 311 have a weight ratio in a range of 60% by weight or more and 75% by weight or less with respect to the total weight of the first wavelength conversion member 31. With the structure in which the weight ratio of the first wavelength conversion particles 311 with respect to the total weight of the first wavelength conversion member 31 is 60% by weight or more, the amount of the first wavelength conversion particles 311 included in the first wavelength conversion member 31 is relatively large. Therefore, the interface between the first matrix 312 and the first wavelength conversion particles 311 is increased in the area size. Such an interface, between the first matrix 312 and the first wavelength conversion particles 311, increased in the area size easily diffuses the light from the light emitting element 20. As a result, the light from the light emitting element 20 is easily diffused in the first wavelength conversion member 31. This can reduce color non-uniformity of distributed light of the light emitting device 1000. With the structure in which the weight ratio of the first wavelength conversion particles 311 with respect to the total weight of the first wavelength conversion member 31 is 75% by weight or less, the ratio of the first matrix 312 in the first wavelength conversion member 31 is relatively high. This can reduce rupture of the first wavelength conversion member. The first wavelength conversion member 31 may include only the first wavelength conversion particles 311 as wavelength conversion particles, or may also include wavelength conversion particles different from that of the first wavelength conversion particles 311.

Figure 2A:
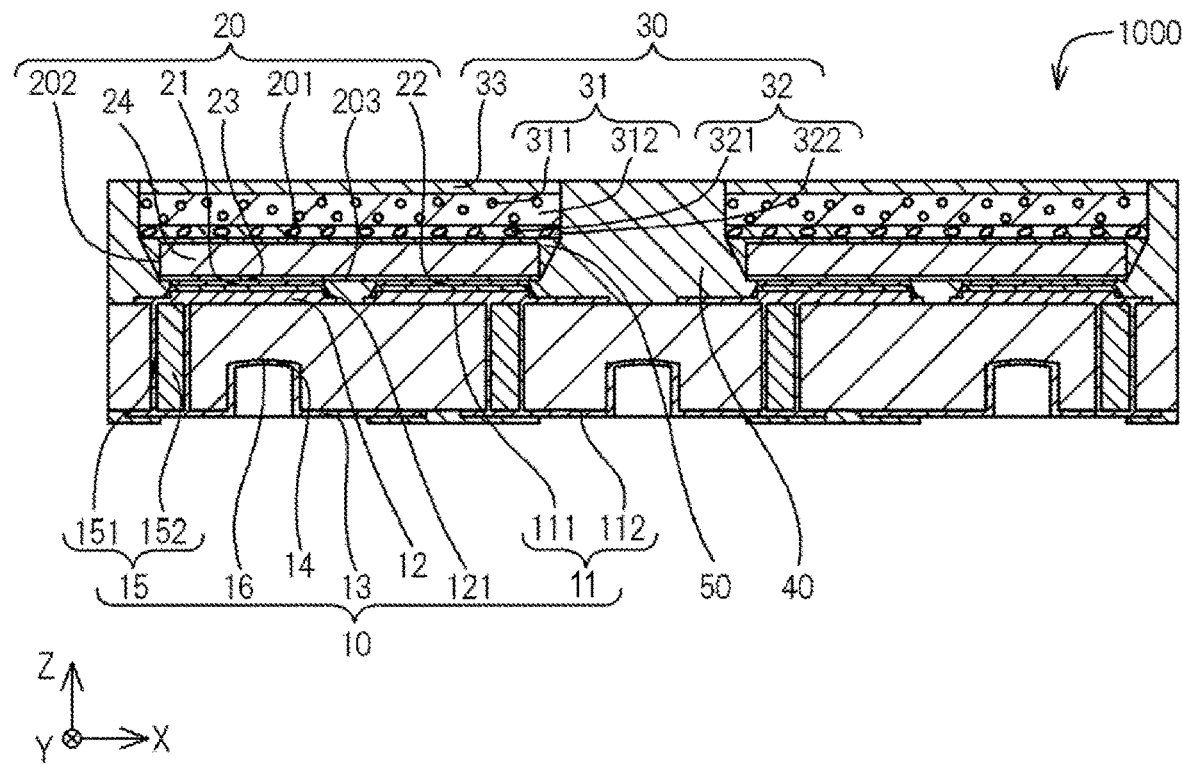
FIG. 2A is a schematic cross-sectional view of the light emitting device taken along line 2A-2A in FIG. 1C.

As the light emitting device 1000 shown in FIG. 2A, the light emitting device according to the present embodiment may include a second wavelength conversion member 32 between the light emitting element 20 and the first wavelength conversion member 31. Alternatively, as the light emitting device 1000A shown in FIG. 2C, the light emitting device according to the present embodiment does not need to include the second wavelength conversion member 32.

The second wavelength conversion member 32 includes a second matrix 322 and second wavelength conversion particles 321. It is preferred that the average particle size of the first wavelength conversion particles 311 is smaller than an average particle size of the second wavelength conversion particles 321. With the structure in which the average particle size of the first wavelength conversion particles 311 is smaller than that of the second wavelength conversion particles 321, the light from the light emitting element 20 is easily diffused in the first wavelength conversion member 31. This can reduce color non-uniformity of distributed light of the light emitting device 1000. With the structure in which the average particle size of the second wavelength conversion particles 321 is greater than that of the first wavelength conversion particles 311, the light from the light emitting element 20 is easily guided to the second wavelength conversion member 32. This can improve the light extraction efficiency of the light emitting device 1000.

The first wavelength conversion particles 311 and the second wavelength conversion particles 321 may be formed of the same material as each other or different materials from each other. The first matrix 312 and the second matrix 322 may be formed of the same material as each other or different materials from each other. In the case where the first matrix 312 and the second matrix 322 are formed of the same material as each other, the joining strength between the first wavelength conversion member 31 and the second wavelength conversion member 32 is increased. In the case where the first matrix 312 and the second matrix 322 are formed of different materials from each other, the first matrix 312 and the second matrix 322 are different in the refractive index. With such an arrangement, the light from the light emitting element 20 is easily diffused at the interface between the first matrix 312 and the second matrix 322. This can reduce color non-uniformity of distributed light of the light emitting device 1000. It is preferred that the refractive index of the first matrix 312 is higher than the refractive index of the second matrix 322. Such an arrangement can mitigate the light from the light emitting element 20 to be totally reflected at the interface between the first matrix 312 and the second matrix 322. This can improve the light extraction efficiency of the light emitting device 1000.

It is preferred that the second wavelength conversion member 32 has a thickness in a range of 20 μm or more and 60 μm or less. With the structure in which the thickness of the second wavelength conversion member 32 is 20 μm or more, the amount of the second wavelength conversion particles 321 included in the second wavelength conversion member 32 can be increased. With the structure in which the thickness of the second wavelength conversion member 32 is 60 μm or less, the light emitting device 1000 can be made thinner. The "thickness of the second wavelength conversion member 32" is a length of the second wavelength conversion member 32 in the Z direction.

It is preferred that the thickness of the second wavelength conversion member 32 is half or less of the thickness of the first wavelength conversion member 31. In this case, the light from the light emitting element 20 is more easily directed toward the first wavelength conversion member 31 than in the case where the second wavelength conversion member 32 is thicker. In the case where, for example, the thickness of the first wavelength conversion member 31 is in a range of 80±5 μm, it is preferred that the thickness of the second wavelength conversion member 32 is in a range of 35±5 μm. A cover member 33 (described below) covering the first wavelength conversion member 31 may have a thickness equivalent to that of the first wavelength conversion member 31. For example, the thickness of the first wavelength conversion member 31 may be in a range of 80±5 μm, the thickness of the second wavelength conversion member 32 may be in a range of 35±5 μm, and the thickness of the cover member 33 may be in a range of 80±5 μm. In this specification, the expression "equivalent thickness" indicates that a tolerance of about 5 μm is allowed.

It is preferred that light from the second wavelength conversion particles 321 excited by the light emitting element 20 has an emission peak wavelength shorter than an emission peak wavelength of light from the first wavelength conversion particles 311 excited by the light emitting element 20. With the arrangement in which the emission peak wavelength of the light from the second wavelength conversion particles 321 excited by the light emitting element 20 is shorter than the emission peak wavelength of the light from the first wavelength conversion particles 311 excited by the light emitting element 20, the first wavelength conversion particles 311 can be excited by the light from the second wavelength conversion particles 321 excited by the light emitting element 20. This can increase the amount of light emitted by excitation of the first wavelength conversion particles 311. Because the first wavelength conversion member 31 is located on the second wavelength conversion member 32, the light from the second wavelength conversion particles 321 excited by the light emitting element 20 is easily directed toward the first wavelength conversion particles 311.

It is preferred that the emission peak wavelength of the light from the first wavelength conversion particles 311 excited by the light emitting element 20 is in a range of 610 nm or longer and 750 nm or shorter and that the emission peak wavelength of the light from the second wavelength conversion particles 321 excited by the light emitting element 20 is in a range of 500 nm or longer and 570 nm or shorter. Such an arrangement can increase color rendering properties of the light emitting device. In the case where the light emitting element 20 emits light having an emission peak wavelength in a range of 430 nm or longer and 475 nm or shorter (in this case, the light emitting element 20 is a blue light emitting element), the first wavelength conversion particles 311 emit light having an emission peak wavelength in a range of 610 nm or longer and 750 nm or shorter when being excited by the light emitting element 20, and the second wavelength conversion particles 321 emits light having an emission peak wavelength in a range of 500 nm or longer and 570 nm or shorter when being excited by the light emitting element 20, the light emitting device 1000 provides white light. For example, the first wavelength conversion particles 311 may comprise or be formed of a phosphor of manganese-activated potassium fluorosilicate, and the second wavelength conversion particles 321 may comprise or be formed of a β-SiAlON-based phosphor. In the case where the first wavelength conversion particles 311 are formed of a phosphor of manganese-activated potassium fluorosilicate, it is preferred to provide the second wavelength conversion member 32 between the light emitting element 20 and the first wavelength conversion member 31. A manganese-activated fluoride phosphor easily causes brightness saturation. However, with the structure in which the second wavelength conversion layer 32 is located between the first wavelength conversion layer 31 and the light emitting element 20, the first wavelength conversion particles 311 is less likely to be excessively irradiated by the light from the light emitting element 20. This can reduce degradation of the first wavelength conversion particles 311.

As shown in FIG. 2A, the light emitting element 20 includes the first surface 201 and the second surface 203 located opposite to the first surface 201. The light emitting element 20 includes at least a semiconductor stack body 23, and positive and negative electrodes 21 and 22. It is preferred that the positive and negative electrodes 21 and 22 are formed at the same surface of the light emitting element 20, and that the light emitting element 20 is flip-chip-mounted on a mounting substrate. Such a structure does not require a wire that supplies electricity to the positive and negative electrodes 21 and 22 of the light emitting element 20, and thus can decrease the size of the light emitting device. In the case where the light emitting element 20 is flip-chip-mounted, the positive and negative electrodes 21 and 22 of the light emitting element 20 are located at the second surface 203. In the present embodiment, the light emitting element 20 includes an element substrate 24, but the element substrate 24 may be removed.

The light guide member 50 covers the lateral surfaces 202 of the light emitting element 20. The light guide member 50 has a higher transmittance to the light from the light emitting element 20 than the reflective member 40. With the structure in which the light guide member 50 covers at least part of the lateral surface 202 of the light emitting element 20, the light emitted from the lateral surface 202 of the light emitting element 20 is easily extracted to the outside of the light emitting device via the light guide member 50. This can improve the light extraction efficiency. The light guide member 50 may include a portion located between the first surface 201 of the light emitting element 20 and a light-transmissive member 30, or does not need to be located between the first surface 201 of the light emitting element 20 and the light-transmissive member 30. The light guide member 50 bonds the light emitting element 20 and the light-transmissive member 30 to each other. Therefore, in the case where the light guide member 50 is located between the first surface 201 of the light emitting element 20 and the light-transmissive member 30, the joining strength between the light emitting element 20 and the light-transmissive member 30 can be increased.

The reflective member 40 covers the lateral surfaces 202 of the light emitting element 20, the lateral surfaces of the light guide member 50, and the lateral surfaces of the first wavelength conversion member 31. With such a structure, the light emitting device has a high contrast between a light emitting region and a non-light emitting region, namely, has a highly clear border between the light emitting region and the non-light emitting region. The reflective member 40 is at least partially in contact with the light emitting element 20. The structure in which the reflective member 40 is at least partially in contact with the light emitting element 20 can decrease the size of the light emitting device. It is preferred that the reflective member 40 is in contact with the second surface 203 of the light emitting element 20. Such a structure can mitigate the light from the light emitting element 20 to be absorbed into the mounting substrate, on which the light emitting element 20 is mounted.

As shown in FIG. 2A, the light emitting device 1000 may include the cover member 33 covering the first wavelength conversion member 31. The cover member 33 includes substantially no wavelength conversion particle. In the case where the light emitting device includes the cover member 33 covering the first wavelength conversion member 31, even if the first wavelength conversion member 31 includes the first wavelength conversion particles, which are weak against moisture, the cover member 33 serves as a protective layer. This can mitigate deterioration of the first wavelength conversion particles 311. The wavelength conversion particles weak against moisture may comprise or be formed of, for example, a manganese-activated fluoride phosphor. The manganese-activated fluoride-based phosphor emits light having a relatively narrow spectral line width, which is preferred from the point of view of color reproducibility. The expression that "includes substantially no wavelength conversion particle" indicates that unavoidable contamination with the wavelength conversion particles is not eliminated. It is preferred that a content of the wavelength conversion particles in the cover layer 33 is 0.05% by weight or lower. In this specification, the first wavelength conversion member 31, the second wavelength conversion member 32 and/or the cover member 33 may be collectively referred to as the "light-transmissive member 30".

Figure 2B:
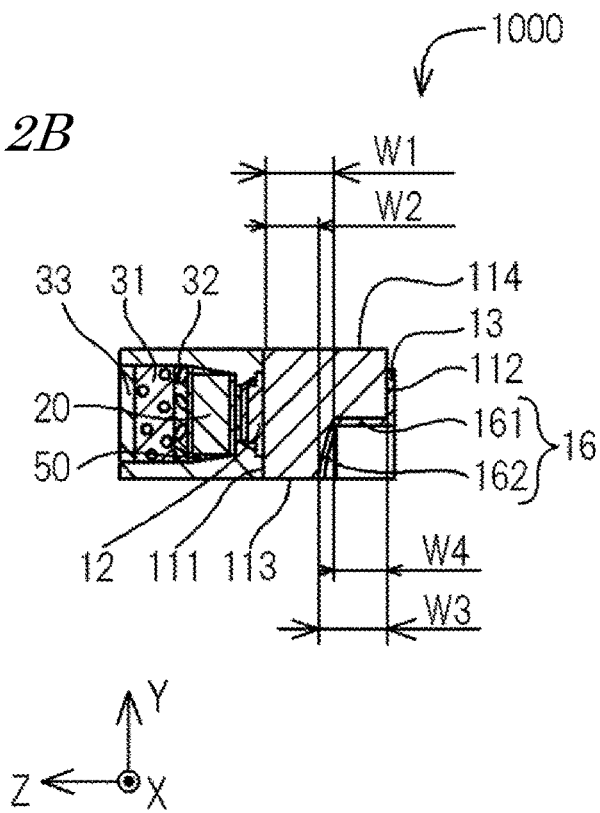
FIG. 2B is a schematic cross-sectional view of the light emitting device taken along line 2B-2B in FIG. 1C.
Figure 2C:
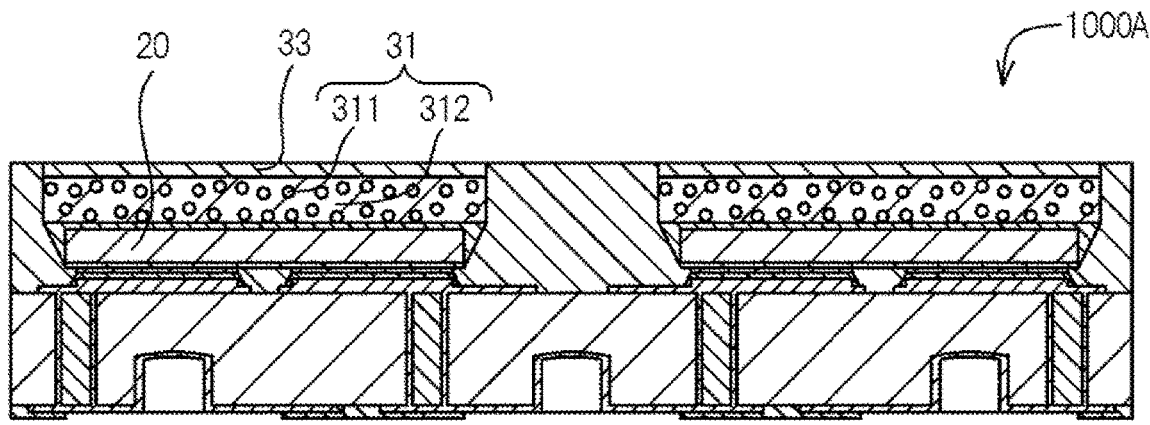
FIG. 2C is a schematic cross-sectional view of alight emitting device in a modification of the embodiment.
Figure 2C:
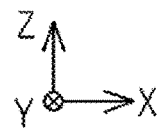
Figure 2D:
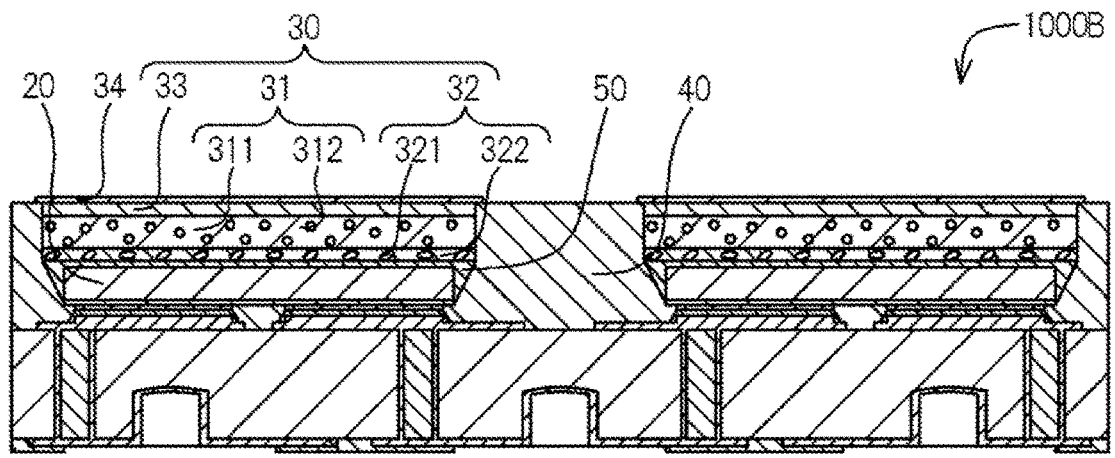
FIG. 2D is a schematic cross-sectional view of alight emitting device in another modification of the embodiment.
Figure 2D:
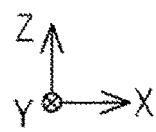

FIG. 2D shows a light emitting device 1000B in another modification of the embodiment. As shown in FIG. 2D, the light emitting device 1000B may include a cover film 34 covering a top surface of the light-transmissive member 30. The cover film 34 may be an aggregate of covering particles, which are nanoparticles. The cover film 34 may be formed of the covering particles, or may include the covering particles and a matrix formed of at least one resin material. With a structure in which the cover film 34 has a refractive index different from that of a portion of the matrix of the light-transmissive member 30 that is located at an outermost surface, the chromaticity of the light emitted by the light emitting device can be corrected. The "portion of the matrix of the light-transmissive member 30 that is located at the outermost surface" refers to the matrix forming a portion at a surface of the light-transmissive member 30 opposite to the light extraction surface of the light emitting element 20. In the case where, for example, the refractive index of the cover film 34 is higher than the refractive index of the portion of the matrix of the light-transmissive member 30 that is located at the outermost surface, the amount of a reflected light portion at an interface between the cover film 34 and the air is larger than the amount of a reflected light portion at an interface between the air and the portion of the matrix of the light-transmissive member 30 that is located at the outermost surface. This increases the amount of the reflected light portion returning into the light-transmissive member 30, and thus the wavelength conversion particles are excited more easily. Therefore, the chromaticity of the light emitted by the light emitting device can be corrected toward the longer wavelength side. By contrast, in the case where the refractive index of the cover film 34 is lower than the refractive index of the portion of the matrix of the light-transmissive member 30 that is located at the outermost surface, the amount of the reflected light portion at the interface between the cover film 34 and the air is smaller than the amount of the reflected light portion at the interface between the air and the portion of the light-transmissive member 30 that is located at the outermost surface. This can decrease the amount of the reflected light portion returning into the light-transmissive member 30, and thus the wavelength conversion particles are less likely to be excited. Therefore, the chromaticity of the light emitted by the light emitting device can be corrected toward the shorter wavelength side.

In the case where, for example, the portion of the matrix of the light-transmissive member 30 that is located at the outermost surface is formed of a phenyl-based silicone resin and the chromaticity of the light emitted by the light emitting device is to be corrected toward the longer wavelength side, the covering particles may be formed of titanium oxide, aluminum oxide or the like. In the case where the portion of the matrix of the light-transmissive member 30 that is located at the outermost surface is formed of a phenyl-based silicone resin, and the chromaticity of the light emitted by the light emitting device is to be corrected toward the shorter wavelength side, the covering particles may be formed of silicon oxide or the like. In the case where the light emitting device includes a plurality of the light-transmissive members 30, the cover film 34 may cover the top surface of one of the light-transmissive members 30, whereas the cover film 34 may be absent on the top surface of another of the light-transmissive members 30. Whether or not to form the cover film 34 covering the top surface of the light-transmissive member 30 may be appropriately selected in accordance with the degree of correction of the chromaticity of the light emitted by the light emitting device. In the case where the light emitting device includes the plurality of light-transmissive members 30, the top surface of one of the light-transmissive members 30 may be covered with a cover film having a refractive index higher than the refractive index of the portion of the matrix of the light-transmissive members 30 that is located at the outermost surface, whereas the top surface of another of the light-transmissive members 30 may be covered with a cover film having a refractive index lower than the refractive index of the portion of the matrix of the light-transmissive member 30 that is located at the outermost surface. The material of the cover film 34 covering the light-transmissive member 30 may be appropriately selected according to the degree of correction of the chromaticity of the light emitted by the light emitting device. The cover film 34 may be formed by a known method such as potting by use of a dispenser, ink-jetting, spraying or the like.

The light emitting device may include a substrate 10, on which the light emitting element 20 is placed (see, e.g., FIG. 2A). The substrate 10 includes, for example, a base member 11, first wiring portions 12, a second wiring portion 13, a third wiring portion 14, and a via 15. The base member 11 includes a front surface 111 extending in a first direction, which is a longer direction, and a second direction, which is a shorter direction, a rear surface 112 located opposite to the front surface 111, a bottom surface 113 adjacent to and perpendicular to the front surface 111, and a top surface 114 located opposite to the bottom surface 113. In this example, as shown in e.g., FIG. 2A, the first direction coincides an X direction and the second direction coincides a Y direction. The base member 11 includes at least one recessed portion 16. The first wiring portions 12 are located on the front surface 111 of the base member 11. The second wiring portion 13 is located on the rear surface 112 of the base member 11. The light emitting element 20 is electrically connected with the first wiring portions 12 and is located on the first wiring portions 12. The reflective member 40 covers the lateral surfaces 202 of the light emitting element 20 and the front surface 111 of the base member 11. The at least one recessed portion 16 is opened on the rear surface 112 and the bottom surface 113. The third wiring portion 14 covers an inner wall of the recessed portion 16, and is electrically connected with the second wiring portion 13. The via 15 is in contact with the first wiring portions 12 and the second wiring portion 13. The via 15 electrically connects the first wiring portions 12 and the second wiring portion 13 to each other. The via 15 runs through the base member 11 from the front surface 111 to the rear surface 112. In this specification, the term "perpendicular" indicates that a tolerance of about ±3 degrees from 90 degrees is allowed.

The via 15 may be in contact with the third wiring portion 14 or may be out of contact with the third wiring portion 14. In the case where the via 15 is in contact with the third wiring portion 14, heat from the light emitting element 20 is transmitted to the second wiring portion 13 and/or the third wiring portion 14 through the via 15. This can improve the level of heat dissipation of the light emitting device 1000. In the case where the via 15 is out of contact with the third wiring portion 14, the via 15 does not overlap the recessed portion 16 as seen in a rear view. This can increase the strength of the substrate 10. In the case where the substrate 10 includes a plurality of the vias 15, one of the vias 15 may be in contact with the third wiring portion 14, whereas another of the vias 15 may be out of contact with the third wiring portion 14.

In the case where the light emitting element 20 is flip-chip-mounted on the substrate 10, the positive and negative electrodes 21 and 22 of the light emitting element 20 are connected with the substrate 10 via a conductive bonding member 60. In the case where the light emitting element 20 is flip-chip-mounted on the substrate 10, it is preferred that the first wiring portions 12 include protrusions 121. With the structure in which the positive and negative electrodes 21 and 22 of the light emitting element 20 are located on the protrusions 121 of the first wiring portions 12, when the first wiring portions 12 are connected with the positive and negative electrodes 21 and 22 of the light emitting element 20 via the conductive bonding member 60, a self-alignment effect is exerted to align the light emitting element 20 and the substrate 10 to each other easily.

It is preferred that the via 15 is circular as seen in a rear view. With such a structure, the via 15 is easily formed by drilling or the like. In this specification, the term "circle" encompasses a true circle and also a shape close thereto (e.g., an ellipse and a quadrangle with four rounded corners).

The via 15 may include a conductive member filling a through-hole formed in the base member 11. Alternatively, as shown in FIG. 2A, the via 15 may include a fourth wiring portion 151 covering an inner surface of the through-hole in the base member 11 and a filling member 152 filling a space enclosed by the fourth wiring portion 151. The filling member 152 may be conductive or insulating. It is preferred that the filling member 152 is formed of a resin material. In general, a resin material before being cured has a higher fluidity than that of a metal material, and therefore, thereby easily fills the space enclosed by the fourth wiring portion 151. Such use of a resin material for the filling member 152 makes it easier to form the substrate 10. A resin material that easily fills the space enclosed by the fourth wiring portion 151 may be, for example, an epoxy resin. In the case where a resin material is used for the filling member 152, it is preferred to add an additive in the resin material in order to decrease the coefficient of linear thermal expansion. Such an arrangement decreases the difference in the coefficient of linear thermal expansion between the filling member 152 and the fourth wiring portion 15, and thus a gap which would be generated by the heat from the light emitting element 20 is less likely to be formed between the fourth wiring portion 15 and the filling member 152. The additive to be incorporated may be, for example, silicon oxide. In the case where the filling member 152 is formed of a metal material, heat dissipation can be improved. In the case where the via 15 includes a conductive member filling the through-hole of the base member 11, it is preferred that the conductive member is formed of a metal material having a high heat conductivity such as Ag, Cu or the like.

The light emitting device 1000 may be secured to a mounting substrate by a joining member such as a solder member or the like formed in the recessed portion 16. The substrate 10 may have one recessed portion 16, or a plurality of the recessed portions 16. In the case where the substrate 10 has the plurality of recessed portions 16, the joining strength between the light emitting device 1000 and the mounting substrate can be increased. The recessed portion 16 may have an equal depth in the Z direction on the top surface 114 side and the bottom surface 113 side, or may be deeper in the Z direction on the bottom surface 113 side than on the top surface 114 side. In the case where as shown in FIG. 2B, the recessed portion 16 may be deeper in the Z direction on the bottom surface 113 side than on the top surface 114 side, thickness W1 in the Z direction of a portion of the base member 11 that is located on the top surface 114 side with respect to the recessed portion 16 is greater than thickness W2 in the Z direction of a portion of the base member 11 that is located on the bottom surface 113 side with respect to the recessed portion 16. This can mitigate a decrease in the strength of the base member 11. In addition, depth W3 of the recessed portion 16 on the bottom surface 113 side is greater than depth W4 of the recessed portion 16 on the top surface 114 side. This increases the volume of the joining member formed in the recessed portion 16. Therefore, the joining strength between the light emitting device 1000 and the mounting substrate can be enhanced. The light emitting device 1000 may be either of a top view type, in which the rear surface 112 of the base member 11 and the mounting substrate face each other, or of a side view type, in which the bottom surface 113 of the base member 11 and the mounting substrate face each other. In either case, the increase in the volume of the joining member can enhance the joining strength between the light emitting device 1000 and the mounting substrate.

The joining strength between the light emitting device 1000 and the mounting substrate can be enhanced especially in the case where the light emitting device 1000 is of the side view type. Because the recessed portion 16 is deeper in the Z direction on the bottom surface 113 side than on the top surface 114 side, the surface area size of the opening of the recessed portion 16 at the bottom surface 113 can be made large. Because the surface area size of the opening of the recessed portion 16 at the bottom surface 113, which faces the mounting substrate, is made large, the surface area size of the joining member located on the bottom surface 113 can also be made large. In this manner, the surface area size of the joining member located on the surface facing the mounting substrate is increased. This can enhance the joining strength between the light emitting device 1000 and the mounting substrate.

It is preferred that the maximum depth of the recessed portion 16 in the Z direction is 0.4 to 0.9 times the thickness of the base member 11 in the Z direction. With the structure in which the depth of the recessed portion 16 is equal to or larger than 0.4 times the thickness of the base member 11, the volume of the joining member formed in the recessed portion 16 is increased. This can enhance the joining strength between the light emitting device 1000 and the mounting substrate. With the structure in which the depth of the recessed portion 16 is equal to or smaller than 0.9 times the thickness of the base member 11, the strength of the base member 11 is less likely to decrease.

As shown in FIG. 2B, it is preferred that the recessed portion 16 has a parallel portion 161 extending from the rear surface 112 in a direction parallel to the bottom surface 113 (i.e., in the Z direction). The provision of the parallel portion 161 can increase the volume of the recessed portion 16 even if the surface area size of the opening of the recessed portion 16 at the rear surface 112 is the same as in the case where the parallel portion 161 is not provided. Such an increased volume of the recessed portion 16 can increase the amount of the joining member such as a solder member or the like to-be formed in the recessed portion 16. This can increase the joining strength between the light emitting device 1000 and the mounting substrate. In this specification, the term "parallel" indicates that a tolerance of about ±3 degrees is allowed. As seen in a cross-sectional view, the recessed portion 16 includes an inclining portion 162 inclining so as to increase the thickness of the base member 11 in the Z direction from the bottom surface 113. The inclining portion 162 may be defined by a straight line or a curved line.

The recessed portion 16 preferably has a maximum height in the Y direction that is 0.3 times to 0.75 times the thickness of the base member 11 in the Y direction. With the structure in which the height of the recessed portion 16 in the Y direction is equal to or larger than 0.3 times the thickness of the base member 11 in the Y direction, the volume of the joining member formed in the recessed portion 16 is increased. This can increase the joining strength between the light emitting device and the mounting substrate. With the structure in which the height of the recessed portion 16 in the Y direction is equal to or smaller than 0.75 times the thickness of the base member 11 in the Y direction, the strength of the base member 11 is less likely to decrease.

Figure 3A:
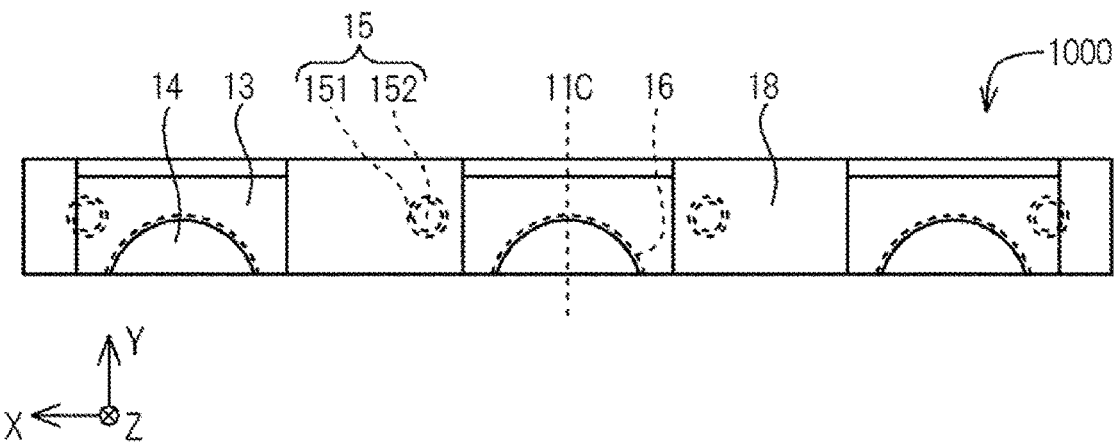
FIG. 3A is a schematic rear view of the light emitting device in the embodiment.

As shown in FIG. 3A, in the case where there are the plurality of recessed portions 16 at the rear surface 112, it is preferred that the plurality of recessed portions 16 are located in a left-right symmetrical manner with respect to a center line 11C (i.e., a line parallel to the Y direction) of the base member 11. With such a structure, when the light emitting device is mounted on the mounting substrate with the joining member, a self-alignment effect is effectively exerted to mount the light emitting device in a predetermined mounting range with high precision.

The light emitting device 1000 may include an insulating film 18 covering a part of the second wiring portion 13. The provision of the insulating film 18 ensures that a rear surface of the light emitting device is insulating and prevents shortcircuiting of the light emitting device. The insulating film 18 also mitigates the second wiring portion to be delaminated from the base member.

Figure 3B:
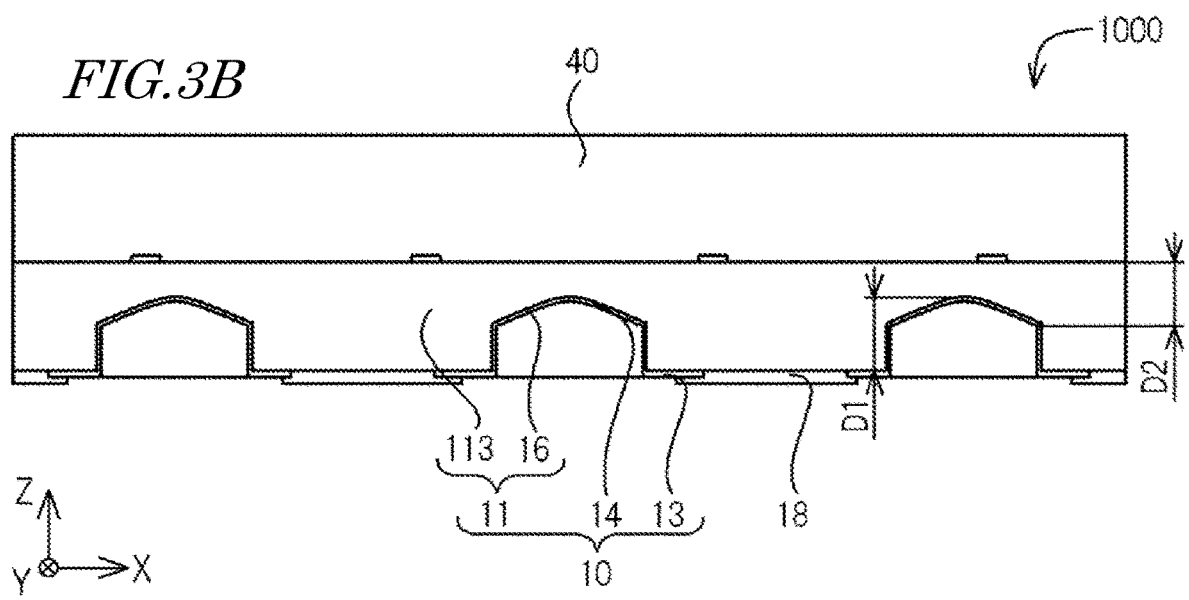
FIG. 3B is a schematic bottom view of the light emitting device in the embodiment.

At the bottom surface 113, the recessed portion 16 may have a generally constant depth in the Z direction, or the depth of the recessed portion 16 may be different between in a central portion and an end portion. It is preferred that as shown in FIG. 3B, at the bottom surface 113, depth D1 of the central portion of the recessed portion 16 is the maximum depth of the recessed portion 16 in the Z direction. With such a structure, at the bottom surface 113, thickness D2 of the base member 11 in the Z direction can be made larger at an end of the recessed portion 16 in the X direction. This can increase the strength of the base member 11. In this specification, the term "central" indicates that a tolerance of about 5 μm from the central portion is allowed. The recessed portion 16 may be formed by a known method such as drilling, laser processing or the like.

Figure 3C:
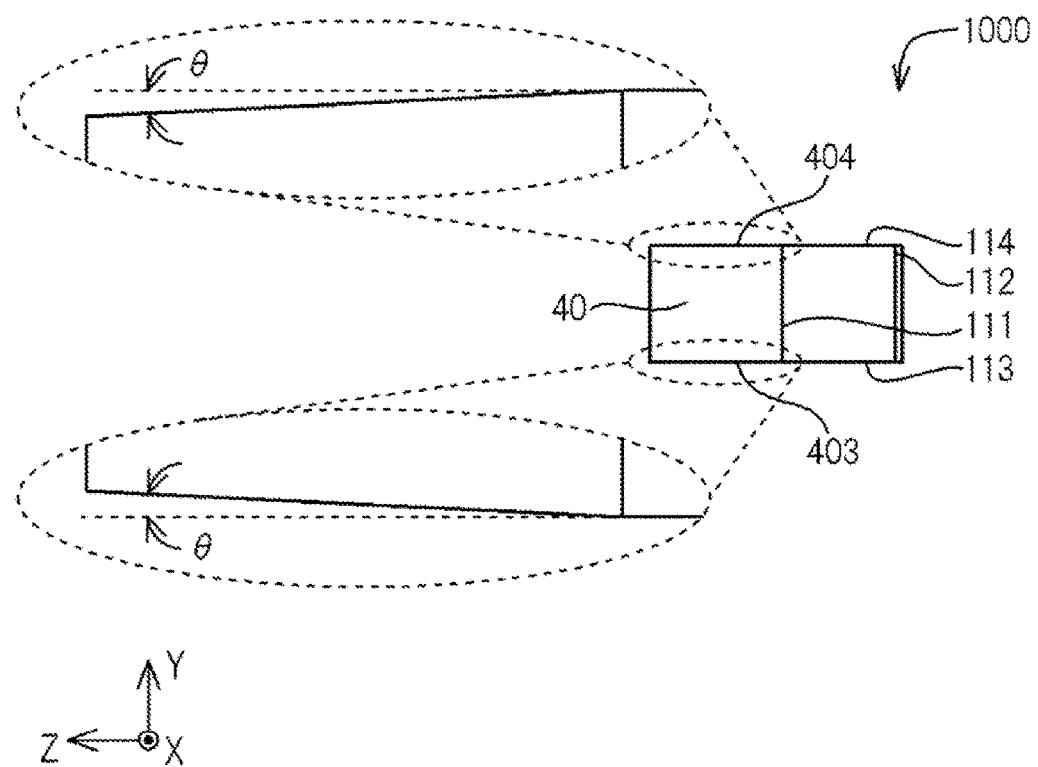
FIG. 3C is a schematic side view of the light emitting device in the embodiment.

As shown in FIG. 3C, it is preferred that a longer lateral surface 403, extending in the longer direction, of the reflective member 40 on the bottom surface 113 side is inclined inward in the light emitting device 1000 while extending in the Z direction. With such a structure, when the light emitting device 1000 is mounted on the mounting substrate, the lateral surface 403 of the reflective member 40 and the mounting substrate are less likely to contact each other. Therefore, the mounting orientation of the light emitting device 1000 tends to be stable during mounting process. A lateral surface 404 of the reflective member 40 extending in the longer direction on the top surface 114 side is preferably inclined toward the inside of the light emitting device 1000 while extending in the Z direction. Such a structure can alleviate contact of the lateral surface of the reflective member 40 with a suction nozzle (also referred to as collet), thereby reducing damage to the reflective member 40 at the time of suction of the light-emitting device 1000. As can be seen, the lateral surface 403 of the reflective member 40 extending in the longer direction on the bottom surface 113 side, and the lateral surface 404 of the reflective member 40 extending in the longer direction on the top surface 114 side, are inclined inward in the light emitting device 1000 while extending from the rear surface 112 toward the front surface 111 (i.e., in the Z direction). The inclination angle θ of the reflective member 40 may be appropriately selected. From the points of view of ease of providing the above-described effects and of the strength of the reflective member 40, the inclination angle θ is preferably 0.3 degrees or larger and 3 degrees or smaller, more preferably 0.5 degrees or larger and 2 degrees or smaller, and still more preferably 0.7 degrees or larger and 1.5 degrees or smaller. It is preferred that a right lateral surface and a left lateral surface of the light emitting device 1000 have substantially the same shape as each other. Such a structure can decrease the size of the light emitting device 1000.

Figure 4:
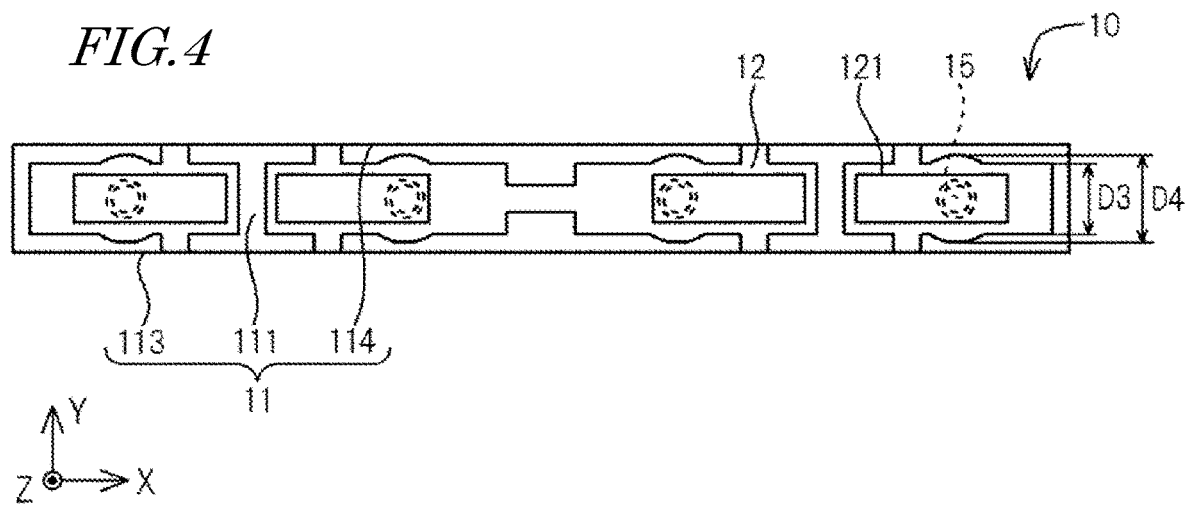
FIG. 4 is a schematic side view of a substrate of the light emitting device in the embodiment.

As in the substrate 10 shown in FIG. 4, it is preferred that the first wiring portions 12 have a narrow portion having a short length in the Y direction and a wide portion having a long length in the Y direction as seen in a front view. Length D3 of the narrow portion in the Y direction is shorter than length D4 of the wide portion in the Y direction. The narrow portion is located at a position which is away from the center of the via 15 in the X direction as seen in a front view, and at which the electrodes 21 and 22 of the light emitting element 20 are located in the X direction. The wide portion is located at the center of the via 15 as seen in a front view. The first wiring portions 12 with the narrow portion can make the area size in which the conductive bonding member 60, electrically connecting the electrodes 21 and 22 of the light emitting element 20 and the first wiring portions 12 to each other, expands in a wet state. This makes it easy to control the shape of the conductive bonding member 60. The corners of the first wiring portions 12 may be rounded.

Figure 5A:
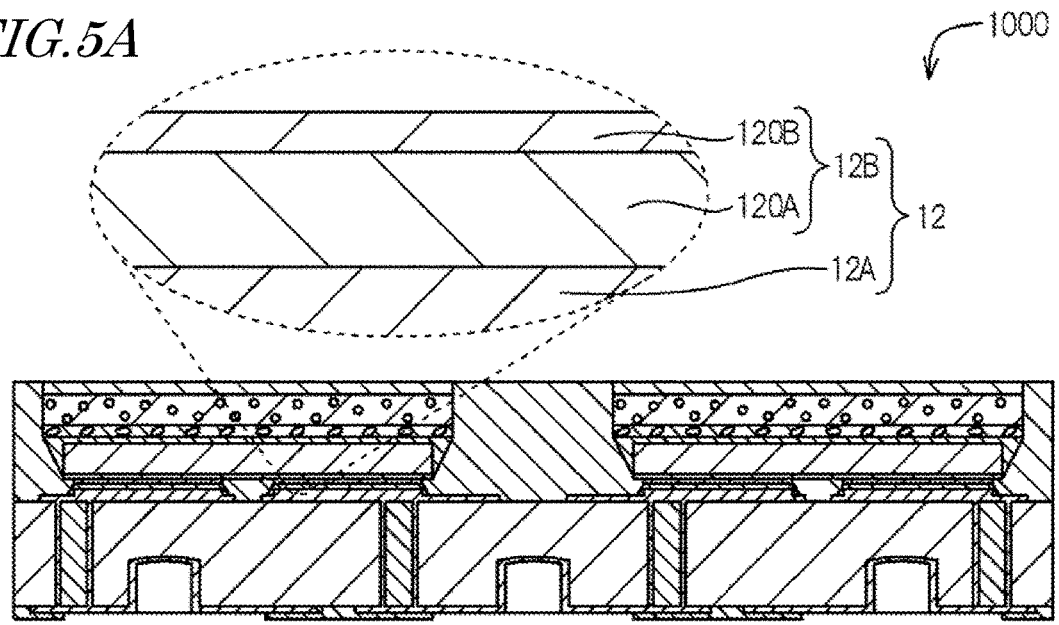
FIG. 5A is a schematic cross-sectional view of the light emitting device in the embodiment, also showing an enlarged view of a portion enclosed by the dashed line.

As shown in FIG. 5A, the first wiring portions 12, the second wiring portion 13 and/or the third wiring portion 14 may each include a wiring main portion 12A and a plating portion 12B formed on the wiring main portion 12A. In this specification, the term "wiring portion" refers to the first wiring portions 12, the second wiring portion 13 and/or the third wiring portion 14. The wiring main portion 12A may be formed of a known material such as copper or the like. The provision of the plating portion 12B on the wiring main portion 12A increases the reflectance of a surface of each wiring or mitigate sulfuration of wiring. For example, a phosphorus-containing nickel plating portion 120A may be provided as the plating portion 12B on the wiring main portion 12A. Nickel, when containing phosphorus, has an increased hardness. Therefore, the provision of the phosphorus-containing nickel plating portion 120A on the wiring main portion 12A can increase the hardness of the wiring. This can mitigate generation of burr on the wiring when the wiring is cut in order to, for example, provide individual light emitting devices. The phosphorus-containing nickel plating portion 120A may be formed by electrolytic plating or electroless plating.

As shown in FIG. 5A, it is preferred that the plating portion 12B includes a gold plating portion 120B at an outermost surface thereof. The provision of the gold plating portion 120B at the outermost surface of the plating portion 12B can mitigate oxidation and corrosion of the surface of the first wiring portions 12, the second wiring portion 13 and/or the third wiring portion 14, and thus provides a high solderability. This can also increase the reflectance of the surface of each wiring or mitigate sulfuration of the wiring. It is preferred that the gold plating portion 120B located at the outermost surface of the plating portion 12B is formed by electrolytic plating. With the electrolytic plating, the amount of catalyst poison such as sulfur or the like is smaller than with the electroless plating. An addition reaction type silicone resin formed by use of a platinum-based catalyst may be cured while being in contact with the gold plating portion 120B. In this case, the gold plating portion 120B, when being formed by electrolytic plating, contains little sulfur and thus can mitigate reaction of sulfur and platinum. This can mitigate an insufficient curing of the addition reaction type silicone resin formed by use of a platinum-based catalyst. In the case where the gold plating portion 120B is formed in contact with the phosphorus-containing nickel plating portion 120A, the phosphorus-containing nickel plating portion 120A and the gold plating portion 120B are preferably formed by electrolytic plating. The other plating portions may be formed by the same plating method, so that the production cost of the light emitting device 1000 can be low. The "nickel plating portion" may contain any other material as long as containing nickel. The "gold plating portion" may contain any other material as long as containing gold.

It is preferred that the phosphorus-containing nickel plating portion 120A is thicker than the gold plating portion 120B. With the structure in which the phosphorus-containing nickel plating portion 120A is thicker than the gold plating portion 120B, it is easier to increase the hardness of the first wiring portions 12, the second wiring portion 13 and/or the third wiring portion 14. The thickness of the phosphorus-containing nickel plating portion 120A is preferably at least 5 times and at most 500 times the thickness of the gold plating portion 120B, and more preferably at least 10 times and at most 100 times the thickness of the gold plating portion 120B.

Figure 5B:
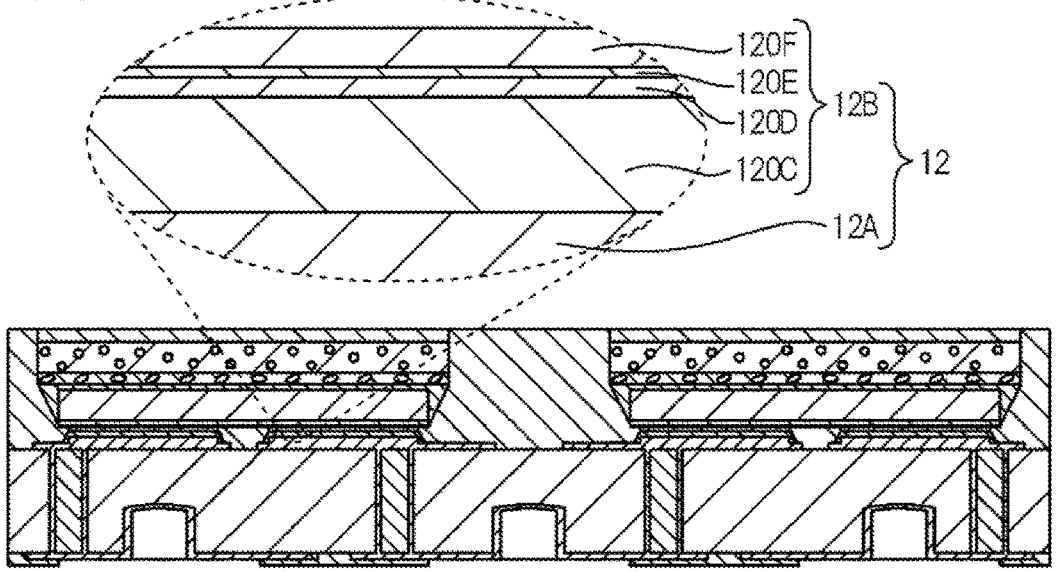
FIG. 5B is a schematic cross-sectional view of alight emitting device in still another modification of the embodiment, also showing an enlarged view of a portion enclosed by the dashed line.

FIG. 5B shows a light emitting device 1000C in still another modification of the embodiment. As shown in FIG. 5B, in the light emitting device 1000C, the plating portion 12B on the wiring main portion 12A of each wiring may include a phosphorus-containing nickel plating portion 120C, a palladium plating portion 120D, a first gold plating portion 120E and a second gold plating portion 120F provided in a stacked manner. In the case where the wiring main portion 12A is formed of copper, the stack of the phosphorus-containing nickel plating portion 120C, the palladium plating portion 120D, the first gold plating portion 120E and the second gold plating portion 120F, for example, mitigate diffusion of copper in the plating portion 12B. This can mitigate a decrease in the adhesiveness between the layers of plating. Among the plating layers on the wiring main portion 12A, the phosphorus-containing nickel plating portion 120C, the palladium plating portion 120D and the first gold plating portion 120E may be formed by electroless plating, whereas the second gold plating portion 120F may be formed by electrolytic plating. The second gold plating portion 120F formed by electrolytic plating may be located at the outermost surface, so that curing of the addition reaction type silicone resin formed by use of a platinum-based catalyst is less likely to be insufficient.

Hereinafter, components of the light emitting device in the embodiment according to the present disclosure will be described.

Light Emitting Element 20

The light emitting element 20 is a semiconductor element that itself emits light by being supplied with a voltage. For the light emitting element 20, a known semiconductor element formed of a nitride semiconductor or the like is usable. The light emitting element 20 may be, for example, an LED chip. Typically, the light emitting element 20 includes at least the semiconductor stack body 23, and in many cases, further includes the element substrate 24. It is preferred that the light emitting element 20 has a quadrangular shape, specifically, a square shape or a rectangular shape longer in one direction, when seen in a plan view. Alternatively, the light emitting element 20 may have any other shape, for example, a hexagonal shape. In the case where the light emitting element 20 is hexagonal, the light emission efficiency can be improved. The lateral surface 202 of the light emitting element 20 may be perpendicular to the top surface (i.e., the first surface 201), or inclined inward or outward with respect to the perpendicular line to the top surface. The light emitting element 20 includes the positive and negative electrodes 21 and 22. The positive and negative electrodes 21 and 22 may be formed of gold, silver, tin, platinum, rhodium, titanium, aluminum, tungsten, palladium, nickel or an alloy thereof. The emission peak wavelength of the light emitting element 20 may be selected from a range of an ultraviolet region to an infrared region according to the type of the semiconductor material or the mixed crystal compositions of materials. A preferred material for the semiconductor stack body may be a nitride semiconductor, which may emit light of a short wavelength capable of exciting the wavelength conversion particles 311 and 321 at a high efficiency. The nitride semiconductor is generally expressed by general formula $In_xAl_yGa_{1-x-y}N$ ($0 \leq x$, $0 \leq y$, $x+y \leq 1$). The emission peak wavelength of the light emitting element is preferably in a range of 400 nm or longer and 530 nm or shorter, more preferably in a range of 420 nm or longer and 490 nm or shorter, and still more preferably in a range of 450 nm or longer and 475 nm or shorter from the points of view of, for example, the light emission efficiency, and the excitation of the wavelength conversion particles 311 and 321, and color mixing between light emitted by the wavelength conversion particles and light emitted by the light emitting element. Other examples of usable semiconductor material include an InAlGaAs-based semiconductor, an InAlGaP-based semiconductor, zinc sulfide, zinc selenide, silicon carbide and the like. The element substrate 24 of the light emitting element is generally a substrate for crystal growth, from which a semiconductor crystal for forming semiconductor stack layers (i.e., the semiconductor stack body 23) can grow. Alternatively, the element substrate 24 may be a support substrate which supports the semiconductor element structure that has been separated from the substrate for crystal growth. The element substrate 24 may be light-transmissive, so that flip-chip mounting is easily applicable and the light extraction efficiency can easily be improved. The element substrate 24 may be a substrate formed of a material comprising sapphire, gallium nitride, aluminum nitride, silicon, silicon carbide, gallium arsenide, gallium phosphide, indium phosphide, zinc sulfide, zinc oxide, zinc selenide, diamond or the like. Among these materials, sapphire is preferred. The thickness of the element substrate 24 may be appropriately selected, and is, for example, in a range of 0.02 mm or more and 1 mm or less. From the point of view of the strength of the element substrate 24 and/or the thickness of the light emitting device, it is preferred that the thickness of the element substrate 24 is in a range of 0.05 mm or more and 0.3 mm or less.

First Wavelength Conversion Member 31

The first wavelength conversion member 31 is provided above the light emitting element 20. The first wavelength conversion member 31 includes the first matrix 312 and the first wavelength conversion particles 311.

First Wavelength Conversion Particles 311

The first wavelength conversion particles 311 absorb at least a part of primary light emitted by the light emitting element 20 and emit secondary light having a wavelength different from that of the primary light. The first wavelength conversion particles 311 may be formed of one material or a combination of two or more materials among the examples shown below.

The first wavelength conversion particles 311 may be known wavelength conversion particles such as, for example, wavelength conversion particles emitting green light, wavelength conversion particles emitting yellow light, and/or wavelength conversion particles emitting red light. Examples of materials of the wavelength conversion particles emitting green light include a yttrium-aluminum-garnet-based phosphor (e.g., $Y_3(Al, Ga)_5O_{12}$: Ce), a lutetium-aluminum-garnet-based phosphor (e.g., $Lu_3(Al, Ga)_5O_{12}$: Ce), a terbium-aluminum-garnet-based phosphor (e.g., $Tb_3(Al, Ga)_5O_{12}$: Ce), a silicate-based phosphor (e.g., $(Ba, Sr)_2SiO_4$: Eu), a chlorosilicate-based phosphor (e.g., $Ca_8Mg(SiO_4)_4Cl_2$: Eu), a β-SiAlON-based phosphor (e.g., $Si_{6-z}Al_zO_zN_{8-z}$: Eu ($0<z<4.2$)), an SGS-based phosphor (e.g., $SrGa_2S_4$: Eu), and the like. Examples of materials of the wavelength conversion particles emitting yellow light include an α-SiAlON-based phosphor (e.g., $M_z(Si, Al)_{12}(O, N)_{16}$ ($0 \leq z \leq 2$; M is Li, Mg, Ca, Y, or a lanthanide element excluding La and Ce), and the like. The above-described examples of material of the wavelength conversion particles emitting green light include a material usable for the wavelength conversion particles emitting yellow light. For example, the yttrium-aluminum-garnet-based phosphor may have a part of Y replaced with Gd, so that the emission peak wavelength is shifted toward the longer side so as to emit yellow light. The above-described examples of material of the wavelength conversion particles emitting yellow light include a material usable for wavelength conversion particles emitting orange light. Examples of materials of the wavelength conversion particles emitting red light include a nitrogen-containing calcium aluminosilicate, such as CASN or SCASN-based phosphor (e.g., $(Sr, Ca)AlSiN_3$: Eu), and the like. Another example of material of the wavelength conversion particles emitting red light may be a manganese-activated fluoride-based phosphor (phosphor represented by general formula (I): $A_2[M_{1-a}Mn_aF_6]$ (in general formula (I), A is at least one element selected from the group consisting of K, Li, Na, Rb, Cs and $NH_4$; M is at least one element selected from the group consisting of the group IV elements and the group XIV elements; and "a" fulfills $0<a<0.2$)). A representative example of the manganese-activated fluoride-based phosphor is a phosphor of manganese-activated potassium fluorosilicate (e.g., $K_2SiF_6$: Mn).

First Matrix 312

The first matrix 312 may comprise or be formed of a material that is light-transmissive to the light emitted by the light emitting element. The term "light-transmissive" refers that a light transmittance at the emission peak wavelength of the light emitting element is preferably 60% or higher, more preferably 70% or higher, and still more preferably 80% or higher. The first matrix 312 may comprise or be formed of a silicone resin, an epoxy resin, a phenol resin, a polycarbonate resin, an acrylic resin, or a modified resin thereof. Alternatively, the first matrix 312 may comprise or be formed of glass. Among these materials, a silicone resin and a modified silicone resin, which are highly resistant against heat and light, are preferred. Examples of the silicone resin include dimethyl silicone resin, phenyl-methyl silicone resin, and diphenyl silicone resin. In this specification, the term "modified resin" encompasses a hybrid resin.

The first matrix 312 may contain diffusive particles, of any of various materials, incorporated thereto. The diffusive particles may comprise or be formed of silicon oxide, aluminum oxide, zirconium oxide, zinc oxide or the like. The diffusive particles may be formed of one material or a combination of two or more materials among these materials. Silicon oxide, which has a small coefficient of thermal expansion, is especially preferred. The diffusive particles may be nanoparticles, so that the degree of scattering of the light emitted by the light emitting element 20 can be increased and thus the amount of the wavelength conversion particles to be used can be decreased.

Light Guide Member 50

The light guide member 50 bonds the light emitting element 20 and the light-transmissive member 30 to each other, and guides the light from the light emitting element 20 to the light-transmissive member 30. A matrix of the light guide member 50 may comprise or be formed of a silicone resin, an epoxy resin, a phenol resin, a polycarbonate resin, an acrylic resin or a modified resin thereof. Among these resins, a silicone resin and a modified silicone resin, which are highly resistant against heat and light, are preferred. Examples of the silicone resin include dimethyl silicone resin, phenyl-methyl silicone resin, and diphenyl silicone resin. The matrix of the light guide member 50 may have diffusive particles contained thereto, like the first matrix 312.

Reflective Member 40

The reflective member 40 has a reflectance of preferably 70% or higher, more preferably 80% or higher, and still more preferably 90% or higher with respect to the emission peak wavelength of the light emitting element 20, from the point of view of the light extraction efficiency in the Z direction. It is also beneficial that the reflective member 40 is white. The white reflective member 40 may be achieved by containing a white pigment in the matrix. The reflective member 40 is in a liquid state before being cured. The reflective member 40 may be formed by transfer molding, injection molding, compressing molding, potting or the like.

Matrix of Reflective Member 40

A matrix of the reflective member 40 may comprise or be formed of a resin, for example, a silicone resin, an epoxy resin, a phenol resin, a polycarbonate resin, an acrylic resin or a modified resin thereof. Among these resins, a silicone resin and a modified silicone resin, which are highly resistant against heat and light, are preferred. Examples of the silicone resin include dimethyl silicone resin, phenyl-methyl silicone resin, and diphenyl silicone resin.

White Pigment

The white pigment may be formed of a single material or a combination of two or more materials selected from the group consisting of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide. The white pigment may have any appropriate shape, and may be irregular or crushed shape. It is preferred that the white pigment is spherical from the point of view of the fluidity. The white pigment may have a particle size of, for example, about in a range of 0.1 μm or more and about 0.5 μm or less. It is preferred that the white pigment is as small as possible in order to improve the effects of light reflection and covering. The content of the white pigment in the reflective member 40 may be appropriately determined, and is, for example, preferably in a range of 10 wt. % or higher and 80 wt. % or lower, more preferably 20 wt. % or higher and 70 wt. % or lower, and still more preferably 30 wt. % or higher and 60 wt. % or lower, from the points of view of the light reflectance, the viscosity in a liquid state and the like. The unit "wt. %" refers to percent by weight, and represents the weight ratio of a material of interest with respect to the total weight of the reflective member 40.

Second Wavelength Conversion Member 32

The second wavelength conversion member 32 may be formed of substantially the same material as that of the first wavelength conversion member 31.

Cover Member 33

The cover member 33 may be formed of substantially the same material as that of the first matrix 312.

Substrate 10

The substrate 10 is a component on which the light emitting element 20 is placed. The substrate 10 includes the base member 11, the first wiring portions 12, at least one second wiring portion 13, at least one third wiring portion 14, and at least one via 15.

Base Member 11

The base member 11 may be formed of an insulating material such as a resin, a ceramic material, glass or the like. Examples of the resin includes epoxy, bismaleimide triazine (BT), polyimide, and the like. The base member 11 may be formed of a fiberglass-reinforced plastic (e.g., glass epoxy resin). Examples of the ceramic material include aluminum oxide, aluminum nitride, zirconium oxide, zirconium nitride, titanium oxide, titanium nitride, a mixture thereof, and the like. Among these materials, it is preferred to use, especially, a material having a coefficient of linear thermal expansion close to that of the light emitting element 20. The lower limit of the thickness of the base member 11 may be appropriately selected. From the point of view of the strength of the base member 11, the thickness of the base member 11 is preferably 0.05 mm or more, and more preferably 0.2 mm or more. From the point of view of the thickness (i.e., depth in the Z direction) of the light emitting device 20, the thickness of the base member 11 is preferably 0.5 mm or less, and more preferably 0.4 mm or less.

First Wiring Portions 12, Second Wiring Portion 13, Third Wiring Portion 14

The first wiring portions 12 is located on the front surface of the substrate 10, and is electrically connected with the light emitting element 20. The second wiring portion 13 is located on the rear surface of the substrate 10, and is electrically connected with the first wiring portions 12 through the via 15. The third wiring portion 14 covers the inner wall of the recessed portion 16, and is electrically connected with the second wiring portion 13. The first wiring portions 12, the second wiring portion 13 and the third wiring portion 14 may be formed of copper, iron, nickel, tungsten, chromium, aluminum, silver, gold, titanium, palladium, rhodium, or an alloy thereof. The first wiring portions 12, the second wiring portion 13 and the third wiring portion 14 may each be formed of a single layer or multilayer of any of the above-listed metal materials and alloys. From the point of view of, especially in heat dissipation, it is preferred to use copper or a copper alloy. The first wiring portions 12 and/or the second wiring portion 13 may be covered with a surface layer of, for example, silver, platinum, aluminum, rhodium, gold or an alloy thereof from the point of view of, for example, the wettability on the conductive bonding member 60 and/or the light reflectance.

Via 15

The via 15 is provided in a through-hole extending from the front surface 111 to the rear surface 112 of the base member 11, and electrically connects the first wiring portions 12 and the second wiring portion 13 to each other. The via 15 may include the fourth wiring portion 151 covering the inner surface of the through-hole in the base member 11 and the filling member 152 filling a space enclosed by the fourth wiring portion 151. The fourth wiring portion 151 may be formed of a conductive material substantially the same as that of the first wiring portions 12, the second wiring portion 13 and the third wiring portion 14. The filling member 152 may be formed of a conductive material or an insulating material.

Insulating Film 18

The insulating film 18 ensures that the rear surface of the light emitting device is insulating and prevents shortcircuiting of the light emitting device. The insulating film 18 may be formed of any material that is used in the field. The insulating film 18 may be formed of, for example, a thermosetting resin, a thermoplastic resin or the like.

Conductive Bonding Member 60

The conductive bonding member 60 electrically connects the electrodes 21 and 22 of the light emitting element 20 and the first wiring portions 12 to each other. The conductive bonding member 60 may be formed of any one of a bump formed of at least one material containing gold, silver, copper or the like; a metal paste containing metal powder of silver, gold, copper, platinum, aluminum, palladium or the like and a resin binder; solder based on tin-bismuth, tin-copper, tin-silver, gold-tin or the like; and brazing material of a low melting-point metal material; and the like.

A light emitting device in an embodiment according to the present disclosure is usable for, for example, backlight devices of liquid crystal display devices; various illumination devices; large-scale displays; various display devices for advertisements, destination guides and the like; projector devices; and image reading devices for digital video cameras, facsimiles, copiers, scanners and the like.

While embodiments of the present invention have been described, it will be apparent to those skilled in the art that the disclosure may be modified in numerous ways and may assume many embodiments other than those specifically described above. Accordingly, it is intended by the appended claims to cover all modifications of the invention that fall within the true spirit and scope of the invention.

What is claimed is:

1. A light emitting device, comprising:
    a light emitting element having a first surface and a second surface located opposite to the first surface;
    a light guide member covering at least a part of a lateral surface of the light emitting element;
    a first wavelength conversion member covering the first surface, the first wavelength conversion member including a first matrix and first wavelength conversion particles;
    a second wavelength conversion member provided between the light emitting element and the first wavelength conversion member, the second wavelength conversion member including a second matrix and second wavelength conversion particles; and
    a reflective member covering the lateral surface of the light emitting element, a lateral surface of the light guide member and a lateral surface of the first wavelength conversion member, the reflective member being in contact with the light emitting element;
    wherein:
    the light emitting element has an emission peak wavelength in a range of 430 nm or longer and 475 nm or shorter;
    the first wavelength conversion particles are capable of emitting light having an emission peak wavelength in a range of 610 nm or longer and 750 nm or shorter when excited by light from the light emitting element;
    the second wavelength conversion particles are capable of emitting light having an emission peak wavelength in a range of 500 nm or longer and 570 nm or shorter when excited by light from the light emitting element; and
    the first wavelength conversion particles have a standard deviation of particle size distribution on a basis of volume of 0.3 µm or less.

2. The light emitting device of claim 1, wherein the first wavelength conversion particles comprise a manganese-activated fluoride phosphor.

3. The light emitting device of claim 2, wherein the first wavelength conversion member has a thickness in a range of 60 µm or more and 120 µm or less.

4. The light emitting device of claim 2, wherein the first wavelength conversion particles have an average particle size in a range of 4 µm or more and 12 µm or less.

5. The light emitting device of claim 2, wherein the first wavelength conversion particles have a central particle size of 4 µm or more and 12 µm or less.

6. The light emitting device of claim 2, wherein a weight ratio of the first wavelength conversion particles is in a range of 60% by weight or more and 75% by weight or less with respect to a total weight of the first wavelength conversion member.

7. The light emitting device of claim 2, wherein the average particle size of the first wavelength conversion particles is smaller than an average particle size of the second wavelength conversion particles.

8. The light emitting device of claim 2, wherein the second wavelength conversion particles comprise a β-SiAlON-based phosphor.

9. The light emitting device of claim 2, wherein the second wavelength conversion member has a thickness in a range of 20 µm or more and 60 µm or less.

10. The light emitting device of claim 2, further comprising a cover member covering the first wavelength conversion member.

11. The light emitting device of claim 1, wherein the first wavelength conversion member has a thickness in a range of 60 µm or more and 120 µm or less.

12. The light emitting device of claim 1, wherein the first wavelength conversion particles have an average particle size in a range of 4 µm or more and 12 µm or less.

13. The light emitting device of claim 1, wherein the first wavelength conversion particles have a central particle size of 4 µm or more and 12 µm or less.

14. The light emitting device of claim 1, wherein a weight ratio of the first wavelength conversion particles is in a range of 60% by weight or more and 75% by weight or less with respect to a total weight of the first wavelength conversion member.

15. The light emitting device of claim 1, wherein the average particle size of the first wavelength conversion particles is smaller than an average particle size of the second wavelength conversion particles.

16. The light emitting device of claim 1, wherein the second wavelength conversion particles comprise a β-SiAlON-based phosphor.

17. The light emitting device of claim 1, wherein the second wavelength conversion member has a thickness in a range of 20 µm or more and 60 µm or less.

18. The light emitting device of claim 1, further comprising a cover member covering the first wavelength conversion member.

\* \* \* \* \*